US012785305B2

(12) United States Patent
Baftiri et al.

(10) Patent No.: US 12,785,305 B2
(45) Date of Patent: Nov. 3, 2026

(54) COMPONENT CARRIER WITH EMBEDDED IC SUBSTRATE INLAY, AND MANUFACTURING METHOD

(71) Applicant: AT&S Austria Technologie & Systemtechnik AG, Leoben (AT)

(72) Inventors: Artan Baftiri, Chongqing (CN); Jeesoo Mok, Chongqing (CN)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 769 days.

(21) Appl. No.: 18/160,229

(22) Filed: Jan. 26, 2023

(65) Prior Publication Data

US 2023/0245990 A1 Aug. 3, 2023

(30) Foreign Application Priority Data

Jan. 28, 2022 (CN) ......................... 202210106398.1

(51) Int. Cl.
*H01R 12/52* (2011.01)
*H10W 70/05* (2026.01)
(Continued)

(52) U.S. Cl.
CPC ............ *H01R 12/52* (2013.01); *H10W 70/05* (2026.01); *H10W 70/611* (2026.01);
(Continued)

(58) Field of Classification Search
CPC ................. H01L 24/20; H01L 21/4846; H01L 21/568; H01L 23/3128; H01L 23/5386;
(Continued)

(56) References Cited

U.S. PATENT DOCUMENTS

| | | | |
|---|---|---|---|
| 10,043,758 | B1 | 8/2018 | Lee et al. |
| 10,043,772 | B2 | 8/2018 | Lee et al. |

(Continued)

FOREIGN PATENT DOCUMENTS

| | | | |
|---|---|---|---|
| CN | 108109985 | A | 6/2018 |
| CN | 110112106 | A | 8/2019 |
| CN | 113745120 | A | 12/2021 |
| EP | 3657915 | A2 | 5/2020 |
| EP | 3876683 | A1 | 9/2021 |
| JP | 2013168539 | A | 8/2013 |

OTHER PUBLICATIONS

Zimmer, R.; Partial European Search Report in Application No. 23152739.1; pp. 1-11; Nov. 14, 2023; European Patent Office; 80298, Munich, Germany.

(Continued)

*Primary Examiner* — Marlon T Fletcher
*Assistant Examiner* — Christina A Sylvia
(74) *Attorney, Agent, or Firm* — Robert A. Blaha; Smith Tempel Blaha LLC

(57) ABSTRACT

A component carrier, including a stack having at least one electrically conductive layer structure and at least one electrically insulating layer structure, a cavity in the stack, an inlay substrate at least partially embedded in the cavity. The inlay substrate includes a component and an IC substrate stacked one above the other, a first redistribution structure that electrically connects the component to a first component carrier main surface, and a second redistribution structure that electrically connects the IC substrate to a second component carrier main surface opposed to the first component carrier main surface.

21 Claims, 7 Drawing Sheets

(51) Int. Cl.

| | |
|---|---|
| ***H10W 70/60*** | (2026.01) |
| ***H10W 70/65*** | (2026.01) |
| ***H10W 70/652*** | (2026.01) |
| ***H10W 74/01*** | (2026.01) |
| ***H10W 74/10*** | (2026.01) |
| ***H10W 90/00*** | (2026.01) |
| *H10W 70/09* | (2026.01) |

(52) U.S. Cl.

CPC ....... *H10W 70/65* (2026.01); *H10W 70/6528* (2026.01); *H10W 74/019* (2026.01); *H10W 74/117* (2026.01); *H10W 90/00* (2026.01); *H10W 70/09* (2026.01); *H10W 90/724* (2026.01)

(58) Field of Classification Search

CPC ................. H01L 24/19; H01L 25/0652; H01L 25/0657; H01L 25/16; H01L 25/18; H01L 24/16; H01L 2224/16237; H01L 2224/19; H01L 2224/214; H01L 24/24; H01L 24/81; H01L 25/105; H01L 23/5389; H01R 12/52; H05K 1/185; H05K 3/4602; H05K 3/0017; H05K 3/0044; H05K 3/4644; H05K 3/4694; H05K 2201/0187; H05K 2201/045; H05K 2203/061; H05K 2203/1469; H05K 2203/308; H05K 3/4697; H10W 70/05; H10W 70/611; H10W 70/65; H10W 74/019; H10W 74/117; H10W 90/00; H10W 70/09; H10W 70/6528; H10W 90/724; H10W 70/60; H10W 72/072; H10W 72/20; H10W 70/614

See application file for complete search history.

(56) References Cited

U.S. PATENT DOCUMENTS

| | | | | |
|---|---|---|---|---|
| 10,045,436 | B2 | 8/2018 | Cho et al. | |
| 10,045,444 | B2 | 8/2018 | Lee et al. | |
| 10,050,016 | B2 | 8/2018 | Lee et al. | |
| 10,061,967 | B2 | 8/2018 | Baek et al. | |
| 10,062,652 | B2 | 8/2018 | Lee et al. | |
| 2008/0062657 | A1 | 3/2008 | Seo et al. | |
| 2010/0032194 | A1 | 2/2010 | Kato | |
| 2010/0097770 | A1 | 4/2010 | Park et al. | |
| 2010/0242272 | A1 | 9/2010 | Kim et al. | |
| 2012/0037411 | A1 | 2/2012 | Hsu et al. | |
| 2012/0291274 | A1 | 11/2012 | Lee et al. | |
| 2015/0041053 | A1 | 2/2015 | Kiwanami et al. | |
| 2015/0062848 | A1 | 3/2015 | Lee et al. | |
| 2015/0282301 | A1 | 10/2015 | Nishida et al. | |
| 2015/0334842 | A1 | 11/2015 | Shimabe et al. | |
| 2016/0276308 | A1 | 9/2016 | Min et al. | |
| 2017/0372980 | A1 | 12/2017 | Kurahashi | |
| 2017/0373980 | A1 | 12/2017 | Mosfeghi | |
| 2019/0057931 | A1 * | 2/2019 | Hsu | H01L 21/78 |
| 2019/0139853 | A1 * | 5/2019 | Oh | H01L 23/49822 |
| 2022/0020605 | A1 | 1/2022 | Essig et al. | |
| 2022/0208629 | A1 * | 6/2022 | Jeong | H01L 23/3121 |

OTHER PUBLICATIONS

Office Action issued in Application No. 202210106398.1; pp. 1-7; May 8, 2026; China National Intellectual Property Administration; No. 6 Xitucheng Road, Haidian District, Beijing, P.R.China, 100088.

English Translation of Office Action issued in Application No. 202210106398.1; pp. 1-7; May 8, 2026; China National Intellectual Property Administration; No. 6 Xitucheng Road, Haidian District, Beijing, P.R.China, 100088.

* cited by examiner

COMPONENT CARRIER WITH EMBEDDED IC SUBSTRATE INLAY, AND MANUFACTURING METHOD

CROSS-REFERENCE TO RELATED APPLICATIONS

This application claims the benefit of the filing date of Chinese Patent Application No. 202210106398.1, filed Jan. 28, 2022, the disclosure of which is hereby incorporated herein by reference.

TECHNICAL FIELD

Embodiments disclosed herein relate to a component carrier and a method of manufacturing a component carrier.

BACKGROUND ART

In the context of growing product functionalities of component carriers equipped with one or more electronic components and increasing miniaturization of such components as well as a rising number of components to be mounted on the component carriers such as printed circuit boards, increasingly more powerful array like components or packages having several components are being employed, which have a plurality of contacts or connections, with ever smaller spacing between these contacts.

In particular, assembling components, such as active components comprising a processor, to a component carrier in an efficient manner may become more and more important in the field of component carrier technology.

Conventionally, components are placed on the surface of component carriers such as printed circuit boards (PCB), for example using a solder or socket connection during a final assembly step of the PCB. Hence, the components are arranged on a top surface of the PCB and thus protrude from the surface of the PCB. However, (active) components may suffer from a limited reliability and from damage due to the exposed arrangement.

FIG. 2 shows a component carrier 200 as known in the art, substantially comprising a stack 201. On a first main surface, there is surface mounted IC substrate 206 and an active component 205 stacked thereon. The stack 201 of the component carrier 200 is thereby extremely high and instable.

SUMMARY

There may be a need to provide a component carrier with a high functionality in a compact and robust manner.

This need may be met by the subject matter according to the independent claims. Advantageous embodiments of the present disclosure are described by the dependent claims.

According to a first aspect of the disclosure, there is provided a component carrier, comprising: i) a stack comprising at least one electrically conductive layer structure and at least one electrically insulating layer structure, ii) a cavity in the stack, iii) an inlay substrate at least partially embedded in the cavity, wherein the inlay substrate comprises a (active) component and an IC substrate stacked one above the other, iv) a first redistribution structure that electrically connects the component to a first component carrier main surface, and v) a second redistribution structure that electrically connects the IC substrate to a second component carrier main surface being opposed to the first component carrier main surface.

According to a further aspect of the disclosure, there is provided a method of manufacturing a component carrier, the method comprising: i) forming a stack comprising at least one electrically conductive layer structure and at least one electrically insulating layer structure, ii) forming a cavity in the stack, and iii) at least partially embedding an inlay substrate in the cavity, wherein the inlay substrate comprises a component and an IC substrate stacked one above the other.

According to a further aspect of the disclosure, there is provided a use (method of using) a cavity in a multi-layer printed circuit board to embed therein an IC substrate with an associated component.

According to a further aspect of the disclosure, there is described a component carrier comprising: i) a stack comprising at least one electrically conductive layer structure and at least one electrically insulating layer structure, defining a first carrier main surface and a second opposed carrier main surface, ii) a fan out structure, comprising multiple components, each comprising multiple layers, said fan out structure being configured to connect its two opposite main surfaces with electrical vias extending from one first main surface to the opposite second main surface forming a density of contacts provided on said first main surface different than the contacts density provided on said second main surface. iii) said fan out structure is (completely) embedded on said component carrier so that the contacts (preferably all the contacts) provided on each of said device first and second main surfaces are directly connected to said opposed carrier main surfaces.

Overview of Embodiments

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for (electronic) components. In particular, a component carrier may be one of a printed circuit board, an organic interposer, a (metal) core substrate, an inorganic substrate, and an IC (integrated circuit) substrate. The IC substrate may, for example, be manufactured in a nanoimprint lithography (NIL) process. A component carrier may also be a hybrid board combining different ones of the above-mentioned types of component carriers. The component carrier may be a multilayer component carrier, wherein at least two layers form a stack.

In the context of the present document, a component carrier may comprise "component carrier material", or in other words, a connected arrangement of one or more electrically insulating layer structures and/or one or more electrically conductive layer structures as used in component carrier technology. More specifically, such component carrier material may be material as used for printed circuit boards (PCBs) or IC substrates. In particular, electrically conductive material of such a component carrier material may comprise copper. Electrically insulating material of the component carrier material may comprise resin, in particular epoxy resin, optionally in combination with reinforcing particles such as glass fibers and/or glass spheres.

In the context of the present document, the term "stack" may particularly denote a structure comprising at least two layers structures, which are substantially arranged on top of each other in a stacking direction. The layer structures may comprise one or more (discrete) layers, which may be arranged on different geometric and substantially parallel planes, but which may also be arranged on the same geometric plane and/or on different geometric planes. The layers of one layer structure may have substantially the same properties. For example, different layers of an electrically insulating layer structure may all be electrically insulating but may comprise or consist of different materials.

In the context of the present document, the term "cavity" may particularly denote a recess (with respect to another part of the component carrier or with respect to another part of a layer or structure of the component carrier), extending partially or entirely through and/or along a layer or structure of the component carrier. The cavity may be configured for accommodating one or more components or inlay substrates.

In the context of the present document, the term "height" (or "thickness") may particularly denote an extension of the stack in a vertical direction (along the z-axis) of the stack. In other words, the stack may have a horizontal extension (e.g., corresponding to a plane of a respective layer) defined by a length and a width, and a vertical extension (or "height" or "thickness"), defined by a (vertical) stacking direction of the layers of the stack, and perpendicular to the horizontal extension. The length (along the x-axis) and the width (along the y-axis) of a component carrier may be considered as the directions of main extension. The thickness along the z-axis may be considered as being perpendicular to the directions of main extension. In a preferred embodiment, the IC substrate and the component of the inlay substrate may be stacked in the z-direction, i.e., perpendicular to the directions of main extension (x, y) of the component carrier. In another example, the inlay substrate may be tilted, for example around 90°, so that the stacking direction of the inlay substrate is parallel to the x-direction or y-direction.

In the context of the present document, the term "IC substrate" (or "IC substrate PCB"; "substrate-like PCB", "IC-size high density PCB") may particularly denote a type of base board used to package a (bare) IC (integrate circuit) chip. In particular, an IC substrate may be regarded as a miniature PCB and not as a common semiconductor substrate. IC substrates may have the advantages of light weight, thinness, and advanced functions, in particular for applications such as in smart phones, laptops, tablet computers, high frequency and high-performance applications. An IC substrate may be flexible or rigid and may have various advantageous properties such as a low coefficient of thermal expansion. In summary, "IC substrate" is a common technical term that refers to a small and highly dense circuit board which may be manufactured as part of a rectangular/quadrangular panel.

In the context of the present document, the term "(active) component" may particularly denote an electronic (micro) device, such as a processor, in particular at least one of the group consisting of a microprocessor, a central processing unit, and a graphical processing unit. In other words, a component may amplify and/or alter the power of a (electronic) signal. Hence, a component may also be one of and/or comprise one of a voltage source, a current source, and a transistor. According to an exemplary embodiment, the disclosure may be based on the idea that a component carrier with a high functionality in a compact and robust manner can be provided, when a component, stacked on an IC substrate to yield an inlay substrate, is embedded in a layer stack cavity of a component carrier, in particular a multilayer printed circuit board. A component may, in the context of the present disclosure, in particular be a "double sided component". In other words, electrical contacts may be provided on both main surfaces of the component for electric connection. This may have the technical effect that multiple components can be stacked on top of each other, whereby overall, (vertical) space may be saved. A component may have at least one, however usually two (opposing) main surfaces, which may be parallel to a main extension of the component carrier along the x-axis and the y-axis, and which may be larger than a surface extending in a thickness direction along the z-axis.

Conventionally, (active) components are surface mounted to a component carrier, whereby the risk of damage and malfunction may be highly increased. Further, an undesired and bulky height is unavoidable in this manner (see FIG. 2).

It has now been found by the inventors that it may be surprisingly efficient to treat a component carrier and an IC substrate not as two separate components, but to use the IC substrate, together with an associated component, as an inlay substrate that may be completely embedded in component carrier material. Further surprisingly, it has been found that increasing the complexity of signal routing in a component carrier, vertical space may be saved and therefore a compact design may be promoted. Moreover, signal loss is reduced, and performance is increased due to shorter connections, in particular due to double sided components as described above. Furthermore, by embedding a package (e.g., a component on the substrate), a yield of the final product (the final component carrier) may be increased since an embedding process of the entire package is not carried out before PCB buildup (or assembly).

When assembling an electronic element to the component carrier, the element may be at least partially accommodated in the cavity of the stack of the component carrier. Thereby, the electronic element is protected by the stack but still electronically and functionally connected to the component carrier.

In particular, an inlay substrate with a high integration density may be easily integrated into a component carrier with a comparably lower integration density. The term "integration density" may, in the context of this disclosure, particularly denote a size (a volume unit or area unit) of a respective contacting area of contacting elements (such as solder balls or pads or the like) on a main surface of a component or an IC substrate etc. For example, if the area of the contacting elements of the component on a first main surface is bigger than the area of the contacting elements of the same component on an opposing second main surface, the integration density with respect to the first main surface is greater, i.e., a "high integration density".

In the following, exemplary embodiments of the component carrier will be described.

According to an exemplary embodiment, the component carrier further comprises an interposer (structure, device) arranged between the component and the IC substrate, in particular configured for electrically connecting the component and the IC substrate. The interposer may for example enable horizontally and/or vertically redistribution of electrical interconnections. Descriptively speaking, if the component has, e.g., four electrical contacts (connections) at its main surface facing the interposer, the interposer structure may for example "reduce" or "redistribute" these connections so that an IC substrate, e.g., comprising less electrical contacts at its main surface facing the interposer structure, may be connected to the component. In general, the interposer structure may also enhance mechanical stability of the component carrier, in particular of the inlay substrate. The interposer may thus be useful for integrating (embedding) an inlay substrate into a component carrier, in particular a pre-manufactured inlay substrate. For example, a component and/or an IC substrate may be assembled to (i.e., mounted to respective main surfaces of) the interposer structure. This assembly may then be, at a preferred point in time, integrated (e.g., embedded) into the stack.

According to an embodiment, the component and the IC substrate may be (indirectly) electrically (and/or mechanically) connected by an electrically conductive material, in particular by one of the group consisting of a solder structure, a sinter structure, in particular a sinter paste, electrically conductive paste, and an electrically conductive adhesive. This may provide the advantage that the component and the IC substrate may be functionally (coupled) integrated (embedded) in a component carrier in a compact manner. In another embodiment, electrically conductive elements of the component carrier, such as pads of the component or of the IC substrate, or electrically conductive material, e.g., electrically conductive material of a (patterned) electrically conductive layer structure of the stack, may be electrically (and/or mechanically) connected with each other by means of thermal compression bonding (and/or ultrasonic bonding). Thermal compression bonding describes a bonding technique and may also be referred to as diffusion bonding, pressure joining, thermocompression welding or solid-state welding. Two metals, preferably the same metals, e.g., copper or gold or any other suitable metal disclosed herein, are brought into atomic contact applying force and heat simultaneously such an interface between the two metals sticks together on an atomic level. This has the beneficial effect that a direct electrical interconnection may be established, without additional steps, in a very compact manner, in particular with regard to an extension in the z-axis direction.

Furthermore, the electric connection between the component and the IC substrate may be established before embedding the inlay substrate into the component carrier. Thus, embedding the inlay substrate may require less precision and the manufacturing process may be more efficient and defects may be reduced.

Furthermore, an orientation of the inlay substrate different from a horizontal orientation, with respect to a main extension of the component carrier, may be enabled. For example, according to some embodiments, the inlay comprising the electrically connected component and IC substrate may be embedded in the component carrier with a vertical orientation. Descriptively speaking, the main direction of extension of the inlay substrate may in some embodiments be in a stacking direction, or in other words, the inlay substrate may be rotated by substantially 90 degrees with respect to a horizontal plane (defined by the X- and Y-axis as described above).

According to a further embodiment, in a vertical direction (Z), the component is located above the IC substrate in the cavity, or, in a vertical direction (Z), the IC substrate is located above the component in the cavity. This may have the advantage that a wide range of design options are possible.

For example, the spatial orientation of the inlay substrate can be made independent from the spatial orientation of the remaining parts of the component carrier. Furthermore, the stacking order of the component and the IC substrate may be adjustable dependent on further (surface mounted) components, if a (electrical) connection between said further component and any one of the IC substrate or the component is desired. Hence, if for example an electric connection between a further component and the IC substrate is required and if the further component is surface mounted on a bottom surface of the component carrier, it is possible to stack the component on top of the IC substrate in the cavity. Thereby, a direct connection between the IC substrate and the further component can be established in an efficient manner and without having the component arranged between the further component and the IC substrate. The same may be possible vice versa.

According to an embodiment, the component and the IC substrate are functionally coupled. For example, the component may control the IC substrate or vice versa. In another example, a further component may be electrically (and functionally) connected to one of the IC substrate and/or the component. In this case, because of the functional coupling of IC substrate and component, the further component may also be indirectly (functionally) coupled to the respective other one of the IC substrate and/or the component and may thus utilize the functions of both the IC substrate and the component.

According to an embodiment, the component carrier comprises a first further component stacked with the IC substrate.

According to a further embodiment of the disclosure, the component and the first further component are arranged on two opposing main surfaces of the IC substrate.

According to yet another embodiment, the component and the first further component are arranged side by side on the same main surface of the IC substrate.

These embodiments may provide the advantage that manifold design options are enabled, while, generally, a very compact design (e.g., with respect to overall thickness of the component carrier) may be possible. Furthermore, in comparison to conventional designs, shorter component-to-component (e.g., chip-to-chip) connections may be possible, which may be advantageous for providing a reliable component carrier. In the aforementioned embodiments, it may be highly advantageous that the IC substrate serves as a substrate for both the component and the further component. Thereby, resources may be saved, and a cost and space efficient component carrier may be provided.

According to an embodiment, the component carrier comprises a second further component being surface mounted on the stack, in particular wherein the surface mounted second further component is electrically coupled with the embedded IC substrate.

This may have the effect that the functionality of the component carrier is be increased, while a compact and flexible design can be maintained. Furthermore, the component, which may according to an embodiment also be electrically and/or functionally coupled to the IC substrate, may thus also be electrically and/or functionally coupled to one or more components (e.g., the further and the second further component) in an easy and efficient way.

According to an embodiment, the IC substrate comprises a plurality of electrically conductive layer structures, and/or an integration density of the electrically conductive layer structures of the IC substrate which is higher than an integration density of electrically conductive layer structures of the stack.

Hence, a very compact design may be provided, while the design flexibility is further improved.

According to an embodiment, the component comprises a processor, in particular at least one of the group consisting of a microprocessor, a central processing unit, and a graphical processing unit.

This may provide the advantage that industry-relevant applications can be directly implemented.

According to a further embodiment, the component comprises at least one pad being oriented downwardly in a vertical direction (Z) (when the IC substrate is stacked with respect to the component in the upward direction), and/or the component comprises at least one pad being oriented upwardly in a vertical direction (Z) (when the IC substrate is stacked with respect to the component in the downward direction).

Thus, electrical and/or functional connections to further components may be efficiently established.

According to an embodiment, the cavity may be formed in an electrically insulating core layer of the electrically insulating layer structure, in particular wherein the electrically insulating core layer structure comprises fully cured core material (e.g., FR4).

If the core material is fully cured, it is substantially not deformable. Hence, even during the manufacturing process, the inlay substrate may be precisely embedded in the non-deformable cavity and furthermore the inlay substrate may be protected from (mechanical) impacts. Thus, damage to the inlay substrate, which may be very susceptible to mechanical and/or chemical and/or physical impacts, may be efficiently prevented during manufacture and during use. Furthermore, this may also contribute to a compact design of the component carrier.

According to an embodiment, the first further component comprises at least one of the group consisting of a component, a passive component, and a heat removal block.

According to an embodiment, the component carrier comprises an optical pathway formed partially by the stack and partially by the component. Thus, the component carrier may be used in optical applications such as a (cell phone) camera, an optical sensor unit, and a light detector.

These embodiments may provide the advantage that industry-relevant applications can be directly implemented.

According to an embodiment of the disclosure, the IC substrate comprises a further redistribution structure.

In the context of the present disclosure, the term "redistribution structure" may refer to an additional structure comprising electrically conductive material (e.g., in the form of a metal layer and/or a conductive via) on an electronic component or a component carrier that makes I/O (inside/outside or input/output) pads of an integrated circuit available to other locations. When an electronic component, e.g. an integrated circuit, is manufactured, it usually has a set of I/O pads that are electrically connected (e.g., wire-bonded) to the pins of a package. A redistribution structure may be a structure of wiring on the chip that enables a simpler chip-to-chip, chip-to-component carrier, or component carrier-to-component carrier bonding. In an embodiment, the electric contacts (e.g., pad, terminal) at the component carrier side of the redistribution structure are smaller than the electric contacts at a main surface of the component carrier. The term "redistribution structure" may also include a redistribution layer (RDL) and/or a so-called "fan out" structure. For example, the redistribution structure may comprise solder balls and/or copper pillars at the side (main surface), which is facing away from the embedded component, in order to be connectable to another, larger, entity. In the context of the present disclosure, the term "fan out structure" may be either a build-up comprising electrically insulating dielectric layers and/or electrically conductive (copper) layers, which are connected by means of vias. However, an IC substrate or an interposer structure could also be considered a fan out structure. A fan out structure, like a redistribution structure, may promote a compact configuration.

In an exemplary embodiment, the electric contacts of the embedded electronic component may be small in size (e.g., small area in a x- and y-direction) and a redistribution structure is hence arranged below the electronic component (still within the component carrier). The redistribution structure may hereby be designed such that the small electric contacts of the electronic component are redistributed into terminals of a larger size, e.g., ball-shaped electric contacts (solder balls). In a most basic embodiment, the redistribution structure may be an interconnection via that connects a small electric contact with a larger electric contact. In particular, the small electric contact of an embedded component (in a component carrier) to a larger electric contact at a main surface of the component carrier. In another embodiment, the redistribution structure may comprise two interconnection vias and an electrically conductive layer between the two vias. Hereby, the vias may be arranged such that they are shifted in the horizontal axis with respect to each other. In this manner it can be taken into consideration that the larger electric contact needs more space than the small electric contact. Hence, by applying an electrically conductive layer between the side-shifted vias, the area for arranging the larger electric contacts may be spread.

Lastly, providing a redistribution structure may have the technical effect that heat from a component, for example from the component and/or the IC substrate, may be dissipated efficiently, even in the case of an unsymmetrical heat production. Thus, a reliable function of the component carrier can be ensured.

According to a further embodiment, the component carrier may comprise a further redistribution structure. As mentioned above, electrical connections between electronic elements (components etc.) of the component carrier may be provided by means of (copper and/or tin) solder balls (which may be substantially spherical) and/or (copper) pillars, each of which may form a so-called (copper) trace. Solder balls may for example be used to connect a copper surface of a via with a connection pad of a component. There may be "thick" traces having a greater extension in an x-axis direction compared to "thin" traces with a smaller extension in an x-axis direction. For example, if traces are formed by solder balls, which may substantially be spherical, then such traces formed by solder balls with a lesser diameter than others may be regarded as thin traces, and vice versa. Solder balls with a small diameter may be used to contact very small pads etc. Generally, it may be preferred that thin traces are used for transmission of data, whereas thick traces are used for power supply. However, due to the spherical shape of solder balls, providing a small diameter also results in a thin trace. Therefore, if there are provided thick traces and thin traces in substantially the same (geometrical) plane, it may be useful to provide said further redistribution layer (and/or pillars, in addition to the small diameter solder balls), for connecting electronic elements with each other and for overcoming dimensional discrepancies, e.g., in a z-direction, between a thin trace and a thicker trace in the same plane.

Therefore, in an exemplary embodiment, the electrically conductive layer structure comprises at least one copper trace, wherein the at least one copper trace is a thin copper trace, in particular configured for transmitting data, or wherein the at least one copper trace is a thick copper trace, in particular configured for transmitting electricity for power supply. The at least one copper trace may comprise copper pillars and/or solder balls. The at least one copper trace may be configured for connecting a component.

According to an embodiment, the IC substrate is electrically coupled with the at least one electrically conductive layer structure of the stack.

Hence, electrically conductive interconnection paths between the IC substrate (and indirectly also the component, according to some embodiments) and different components and/or regions of the component carrier may be established.

According to an embodiment, the inlay substrate is embedded in electrically insulating material, in particular resin. Hence, during manufacture, as will be explained in more detail below, the not fully cured (and deformable) resin material may flow around the inlay substrate and ensure safe and efficient embedding, in particular full embedding (encapsulation). In a preferred embodiment, the electrically insulating material may be reinforced, e.g., may comprise reinforcing material such as glass spheres. Glass spheres may have the effect that tension is reduced during the manufacturing process. In contrast, the use of glass fiber reinforced electrically insulating material may be less preferred in some embodiments, since tension during the manufacturing process may thus be increased.

According to an embodiment, the method for manufacturing a component carrier further comprises stacking the component and the IC substrate before embedding the component and the IC substrate in the cavity.

Accordingly, the inlay substrate may be formed (manufactured) in a separate manufacturing step (or even in a separate manufacturing plant) and may thus be embedded as a prefabricated element. Therefore, embedding the thus pre-formed inlay substrate may require less precision, the manufacturing process may be more efficient, and defects may be reduced.

According to an embodiment, the method further comprises inserting the component or the IC substrate in the cavity and thereafter stacking the respective other one of the component and the IC substrate thereon in the cavity.

This provides a flexible manufacturing process, because individual combinations of IC substrate and different components may be facilitated in the same process.

According to an embodiment, the method further comprises pressing the component, in particular the component arranged in the cavity, in a first electrically insulating layer of the electrically insulating layer structure, so that the component becomes at least partially embedded by the first electrically insulating layer, and/or pressing the IC substrate, in particular the IC substrate arranged in the cavity, in a second electrically insulating layer of the electrically insulating layer structure, so that the IC substrate becomes at least partially embedded by the second electrically insulating layer. In an example, the first electrically insulating layer and/or the second electrically insulating layer comprises prepreg. In another example, the first electrically insulating layer and/or the second electrically insulating layer comprises a not fully cured, deformable resin that is not prepreg.

In another embodiment, the (prefabricated) inlay, as has been described in detail above, may be pressed into an electrically insulating layer, in particular comprising an at least only partially cured material, which may be capable of assuming the form of an element pressed therein, such that it completely encloses the element (e.g., the component, the IC substrate, or the inlay substrate).

This may provide the advantage that the electronic component can be fixed and embedded in a fast and efficient manner. It is noted that other materials than prepreg with similar properties may be used according to other embodiments of the present disclosure.

It is further mentioned that the electrically insulating core layer of the stack may have a coefficient of thermal expansion (CTE) of 5 to 12 ppm/K. If the inlay substrate is exchanged by a high-density layer interconnection area (HDI; state of the art) the CTE of an organic layer (e.g., Ajinomoto Build-up Film(ABF)® material) of the HDI is 8 to 12 ppm/K. Ajinomoto Build-Up Film(ABF)® is a registered mark of Ajinomoto Co., Inc. of Tokyo, Japan. However, since the CTE of Copper (Cu), is about 17 ppm/K, the high copper content of this area is governing the CTE of the entire area and is therefore also quite high (for example 15 to 17 ppm/K).

It may therefore be advantageous to use the inlay substrate because material of the inlay substrate (e.g., glass, silicon, or ceramic) has a comparably low CTE (e.g., 3 to 10 ppm/K), which is also similar to the CTE of the core layer itself. Therefore, less warpage will occur during manufacturing, which increases the reliability of the manufacturing process. Even if one of the constituents of the inlay substrate comprises a (higher) copper content, the entire inlay structure exhibits a similar CTE as the core layer.

According to an embodiment, the inlay substrate has a CTE value in a range of 0.2 to 70 ppm/K, preferably in a range of 0.5 to 45 ppm/K, more preferably in a range of 0.7 to 25 ppm/K.

According to a further embodiment, the (surface mounted) component and/or further (surface mounted) component(s), in particular such components and/or further components arranged at opposing sides of a component carrier, are electrically connected with each other through the inlay substrate (and its elements, i.e., the interposer structure, the component, the IC substrate, etc.), such as to form a vertical electrical pathway. This may have the technical effect that is possible to connect components which are mounted on opposite sides or surfaces of the component carrier (and of the inlay substrate) via the inlay substrate. A compact configuration of the component carrier may be a further advantage of this embodiment. According to an embodiment, at least one of the component, the IC substrate, and the further components comprise a multi layered structure.

According to an embodiment, the fan out structure comprises the component and/or the IC substrate.

According to an embodiment, the component carrier comprises the interposer structure arranged between the component and the IC substrate, wherein the interposer structure is in particular configured for electrically connecting the component and the IC substrate.

According to an embodiment, the component carrier comprises a fan out structure arranged in the stack.

According to an embodiment, an electrical connection from one carrier main surface to the opposite carrier main surface is a vertical connection through (an intermediate connection of) the fan out structure.

According to an embodiment, the integration density of contacts provided on one component carrier main surface is greater than the integration density of contacts provided on the opposed component carrier main surface.

According to an embodiment, the fan out structure comprises a first main surface and an opposing second main surface, wherein the first main surface of the fan out structure has a higher contact integration density than the second main surface of the fan out structure, and wherein the component carrier main surface comprising the higher contact integration density is facing the first main surface of the fan out structure.

According to an embodiment, the redistribution structure (i.e., the fan out structure) comprises an intermediate layer between two components, the intermediate layer having (vertical) at least partially electrically conductive vias connecting contacts of one of the two components to contacts provided on a respective surface of the respective other one of the two components, wherein the contacts are provided on respective main surfaces of the components, wherein the respective main surfaces face each other.

According to another embodiment, the intermediate layer has a thickness (in a Z-direction) in a range of 1 to 3000 μm, preferably of 5 to 1500 μm, more preferably of 10 to 600 μm.

In the following, further exemplary embodiments of the component carrier and/or the method will be explained.

In the context of the present document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present document, the term "substrate" may particularly denote a small component carrier. A substrate may be a, in relation to a PCB, comparably small component carrier onto which one or more components may be mounted and that may function as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher integration density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo imageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE), polyvinylidene fluoride (PVDF), and/or a combination thereof. Reinforcing structures such as webs, fibers, spheres, or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photo-imageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, platinum, silicon, in particular doped silicon, carbon and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay substrate, an electrically conductive inlay substrate (such as a metal inlay substrate, preferably comprising copper or aluminum), a heat transfer unit (for example a heat pipe), a light guiding element (for example an optical waveguide or a light conductor connection), an electronic component, or combinations thereof. An inlay substrate can be for instance a metal block, with or without an insulating material coating (IMS-inlay substrate), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to an embodiment, the inlay substrate comprises a first inlay main surface and a second opposed inlay main surface, in particular on the component and on the IC substrate, respectively. Preferably, the first and second main surfaces are each provided with electric contacts, in particular the contacts of the first main surface are connected with the contacts of the second main surface through the component and the IC substrate. According to a preferred embodiment of the disclosure, the contacts (preferably all the contacts) provided on each of said first and second main surfaces of the inlay substrate are directly connected to opposed carrier main surfaces. Preferably the number of contacts on the first main surface of the inlay substrate is higher than the amount of contacts on the second main surface of the inlay substrate. This may have the technical effect that the inlay substrate also acts as a fan out device (or redistribution device). It may be possible that the related contacts are connected to the two opposed redistribution structures through the configuration of the embedded component and the IC substrate.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

It has to be noted that embodiments of the disclosure have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above, and further aspects of the present disclosure are apparent from the examples of embodiment to be described hereinafter and are explained with reference to the examples of embodiment. The disclosure will be described in more detail hereinafter with reference to examples of embodiments, to which examples the disclosure is, however, not limited.

DETAILED DESCRIPTION OF ILLUSTRATED EMBODIMENTS

Figure 1:
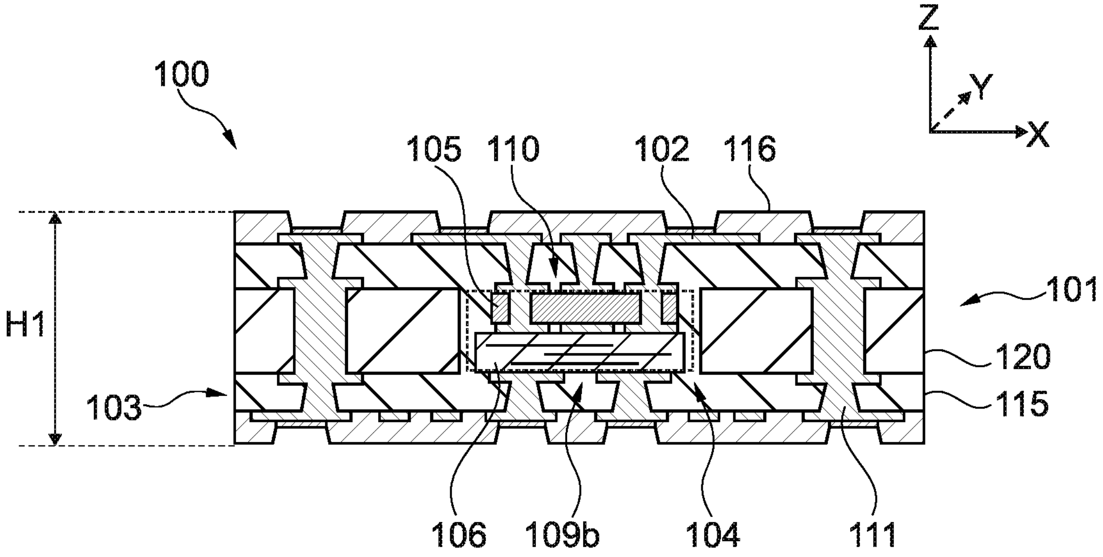
FIG. 1 shows a cross-sectional view of a stack of a component carrier with an inlay substrate, according to an exemplary embodiment of the disclosure.

The illustrations in the drawings are schematically presented. It is noted that in different figures, similar or identical elements or features are provided with the same reference signs. In order to avoid unnecessary repetitions, elements or features which have already been elucidated with respect to a previously described embodiment are not elucidated again at a later position of the description.

Furthermore, spatially relative terms, such as “front” and “back”, “above” and “below”, “left” and “right”, et cetera are used to describe an element’s relationship to another element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting, as an apparatus according to an embodiment of the disclosure can assume orientations different than those illustrated in the figures when in use.

Figure 2:
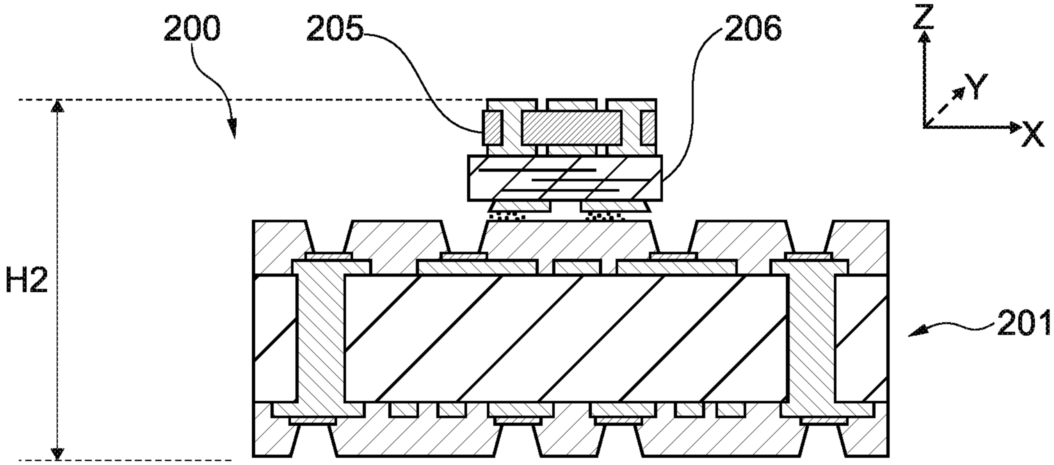
Fig. 2 Prior art
FIG. 2 shows a cross-sectional view of a stack of a component carrier as known in the art.

FIG. 1 shows a cross-sectional view of a stack 101 of a component carrier 100 with an inlay substrate 110, according to an exemplary embodiment of the disclosure. The component carrier 100 comprises a stack 101 comprising an electrically conductive layer structure 102 and an electrically insulating layer structure 103, a cavity 104 in the stack 101, and an inlay substrate 110 embedded in the cavity 104, wherein the inlay substrate 110 comprises a component 105 stacked on top of an IC substrate 106. The electrically insulating layer structure 103 comprises an electrically insulating core layer 120, electrically insulating material 115, and electrically insulating layers 116 covering a top main surface and a bottom main surface of the component carrier 100. The component carrier 100 is further provided with electrically conductive through connections 111, formed as vias, and electrically connecting the layers of the electrically conductive layer structure 102. In accordance with an exemplary embodiment of the disclosure, the electrically insulating material 115 comprises or consists of prepreg. As can also be taken from FIG. 1, the component carrier 100 comprises a redistribution structure 109, arranged underneath the IC substrate 106. The stack 101 of the component carrier 100 has an overall height or thickness H1 in a vertical stacking direction Z. H1 is significantly lower than H2 (compare FIG. 2 described above), although the component carriers 100 and 200 substantially have the same functionality, provided by similar electronic elements 105, 106 and 205, 206, respectively.

Hence, by at least partially embedding an inlay 110 comprising the component 105 and the IC substrate 106 according to exemplary embodiments of the disclosure, the electronic elements are protected by the stack 101, but are still electronically and functionally connected to the component carrier 100. In addition, the component carrier 100 has a very compact design when compared to conventional component carriers, which becomes apparent from H1 being smaller than H2.

Figure 3:
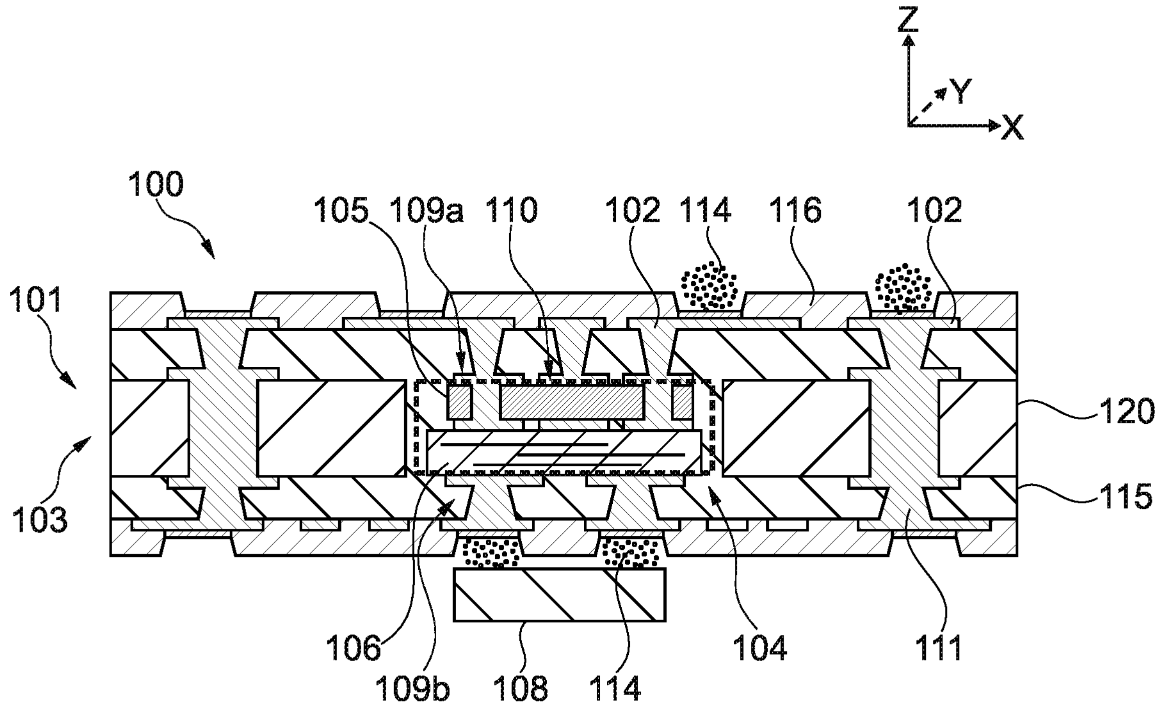
FIG. 3 and FIG. 4 show a cross-sectional view of a stack of a component carrier with an inlay substrate and a surface mounted component, according to an exemplary embodiment of the disclosure.

FIG. 3 shows a cross-sectional view of a stack 101 of a component carrier 100 with an inlay substrate 110 and a surface mounted component 108 (i.e., mounted on a surface of the component carrier 100), according to an embodiment of the disclosure. In this example, in a vertical direction Z, the component 105 is located above the IC substrate 106 in the cavity 104. In some embodiments, which are for example illustrated in FIG. 13, a first further component 107 may also be stacked with the IC substrate 106. However, in the example shown in FIG. 3, a second further component 108 is surface mounted on a bottom main surface of the component carrier 100. The second further component 108 and the IC substrate 106 are electrically connected. Furthermore, there are provided solder balls 114, which may serve as mounting points for even further components. As can also be taken from FIG. 3, there is provided a first redistribution structure 109*a* that electrically connects the component 105 to a first component carrier main surface (e.g., a top main surface), and a second redistribution structure 109*b* that electrically connects the IC substrate 106 to a second component carrier main surface (e.g., a bottom main surface) being opposed to the first component carrier main surface.

Figure 4:
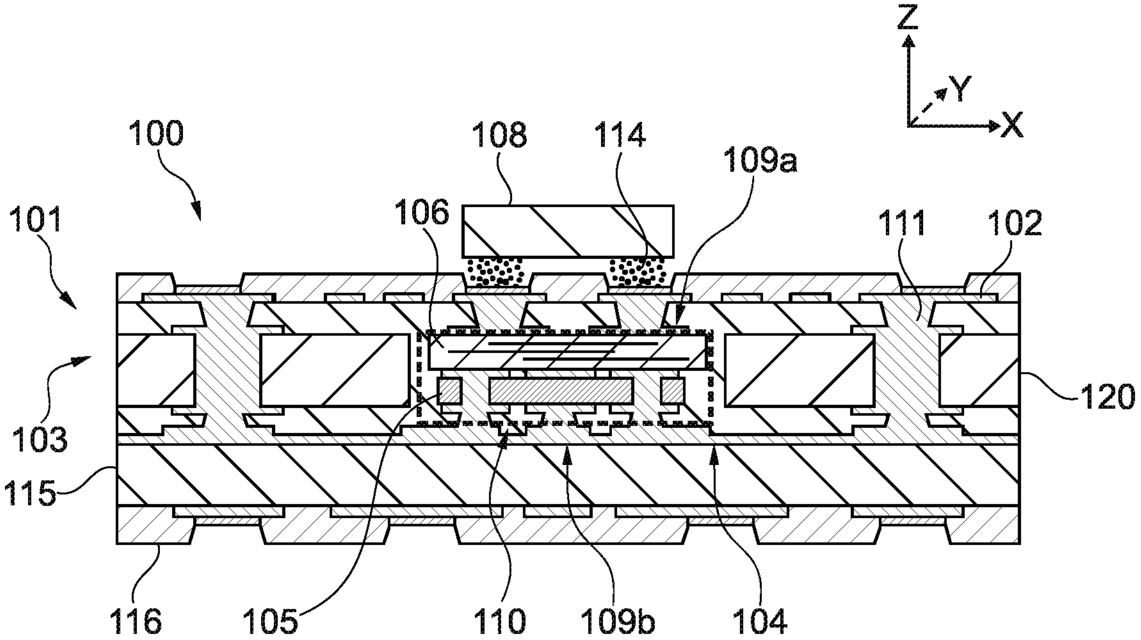

The component carrier 100 depicted in FIG. 4 shows a similar configuration. However, in this example, the second further component 108 is surface mounted on a top main surface of the component carrier 100 and accordingly, the IC substrate 106 is stacked on top of the component 105 in the cavity 104.

In both examples, as shown in FIGS. 3 and 4, the surface mounted second further component 108 is electrically coupled with the embedded IC substrate 106 in the cavity 104. Thus, the component 105, which is also electrically and/or functionally coupled to the IC substrate 106, is also (indirectly) electrically and/or functionally coupled to the second further component 108.

Figure 5:
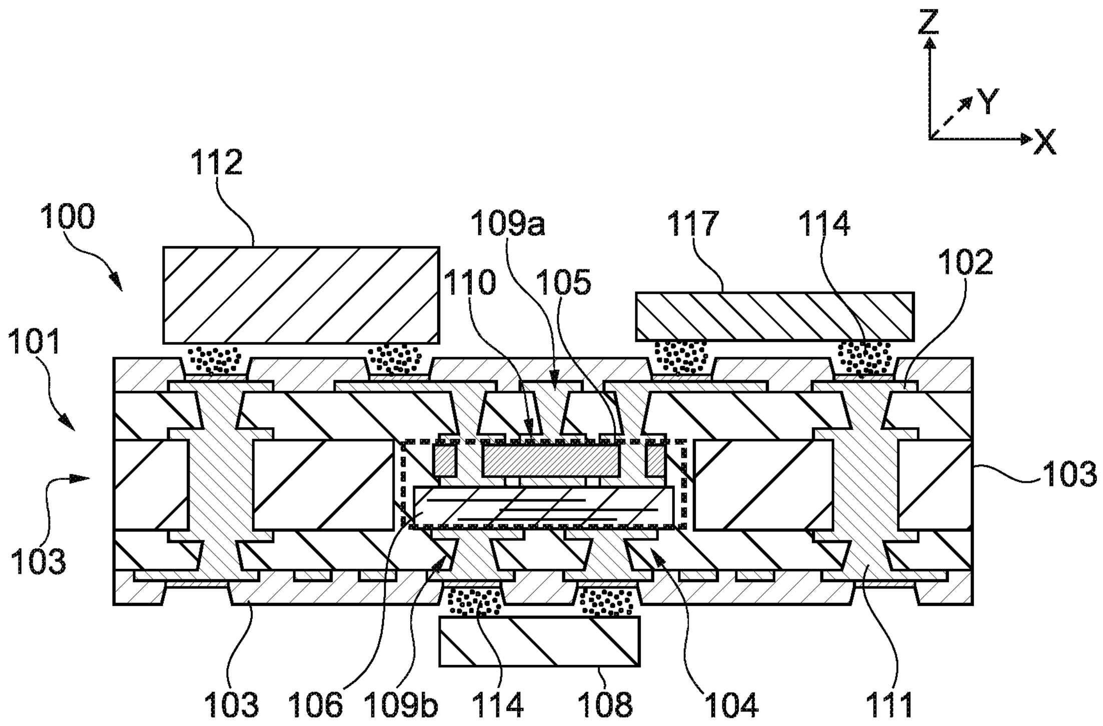
FIG. 5 and FIG. 6 illustrate cross-sectional views of different configurations of a component carrier with an inlay substrate and a plurality of surface mounted components, according to exemplary embodiments of the disclosure.
Figure 6:
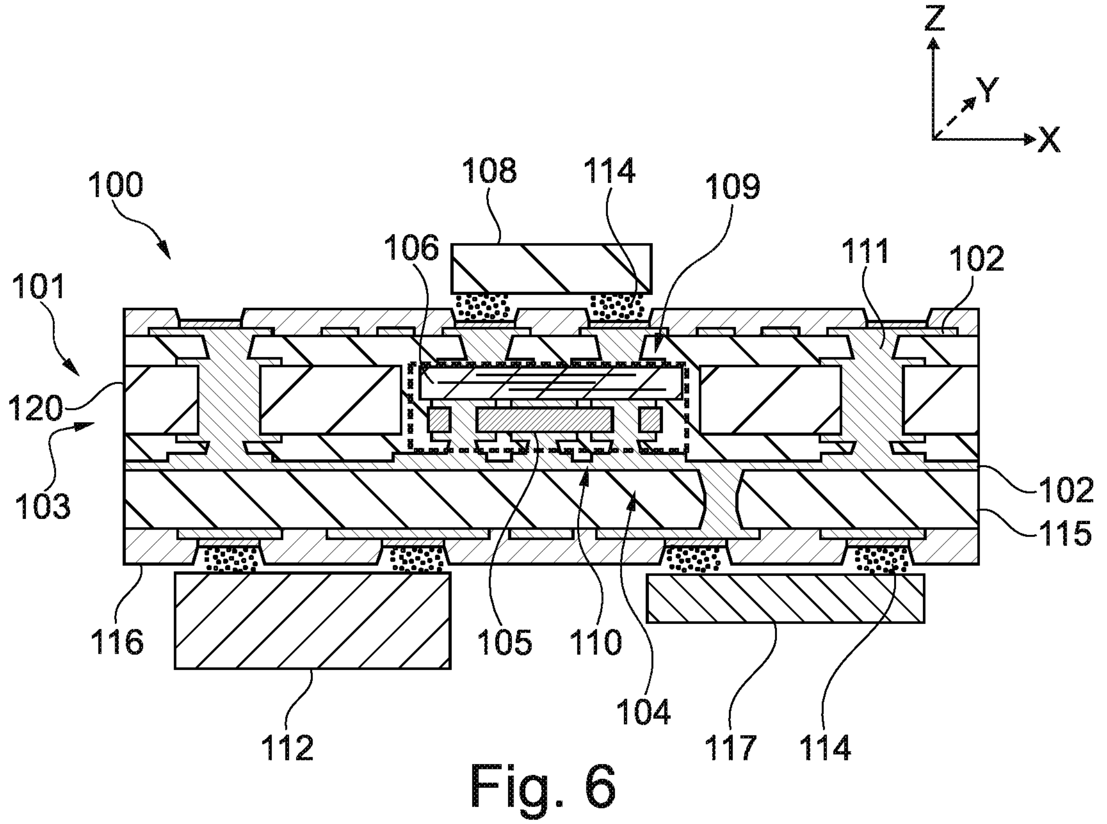

FIG. 5 and FIG. 6 show cross-sectional views of different configurations of a component carrier 100 with an inlay substrate 110 and a plurality of surface mounted components 108, 112, and 117, according to exemplary embodiments of the disclosure. In comparison to the examples of the disclosure depicted for example in FIG. 3 and FIG. 4, the component carriers 100 of FIG. 5 and FIG. 6 further comprise a third further component 112 and a fourth further component 117. All further components 108, 112, and 117 are surface mounted via solder balls 114 and are thus directly or indirectly electrically and/or functionally connected to one another and also to the IC substrate 106 or the component 105, respectively.

In FIG. 5, the first further component 108 is surface mounted on the bottom main surface of the component carrier 100 and directly electrically connected to the IC substrate 106. The component carrier also comprises a first and second redistribution structure 109*a*, 109*b* and the IC substrate 106 is electrically connected to the component 105 stacked on top of the IC substrate 106.

In FIG. 6, the IC substrate 106 is, however, stacked on top of the component 105. The first further component 108 is surface mounted, via solder balls 114, on a top main surface of the component carrier 100, and electrically and/or functionally connected (coupled) to the IC substrate 106 and thus also electrically and/or functionally coupled to the component 105 in the cavity 104.

FIG. 7, FIG. 8, FIG. 9, FIG. 10, FIG. 11, and FIG. 12 show different steps in the manufacturing of a component carrier 100 comprising an inlay substrate 110, according to exemplary embodiments of the disclosure.

Figure 7:
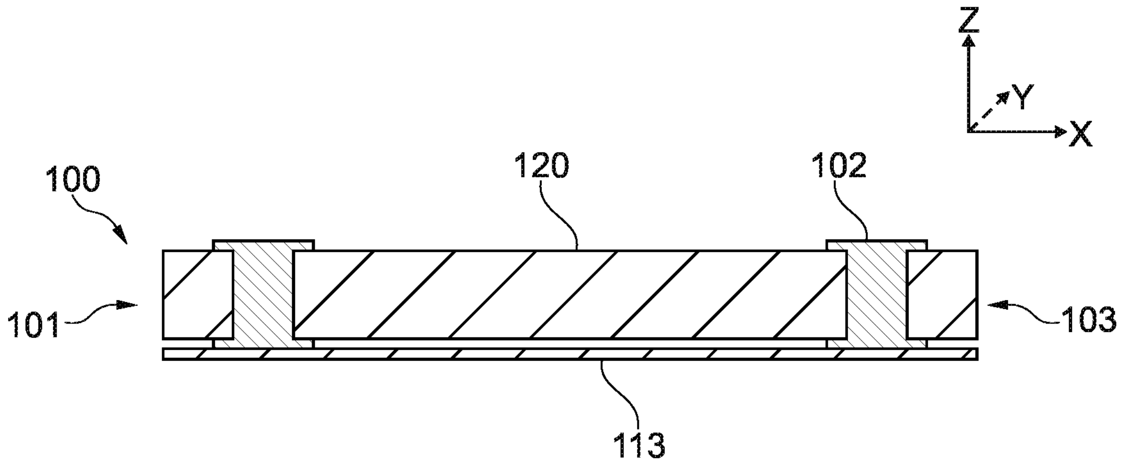
FIG. 7, FIG. 8, FIG. 9, FIG. 10, FIG. 11, and FIG. 12 show different steps in the manufacturing of a component carrier comprising an inlay substrate, according to exemplary embodiments of the disclosure.

In FIG. 7 a stack 101 is provided comprising an electrically conductive layer structure 102 and an electrically insulating layer structure 103, which is comprised of the electrically insulating core layer 120. In the exemplary embodiment shown in FIG. 7 to FIG. 10, the stack 101 is placed on a release layer 113 (e.g., a temporary carrier) and fixed thereon, e.g., by use of an adhesive.

Figure 8:
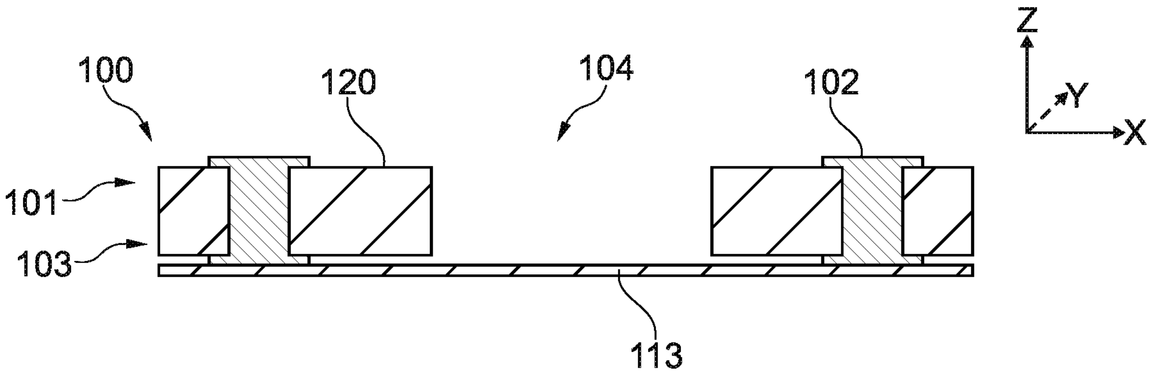

In FIG. 8 a cavity 104 is formed, e.g., by one of laser or mechanical drilling, etching, cutting, or a similar and suitable procedure.

Figure 9:
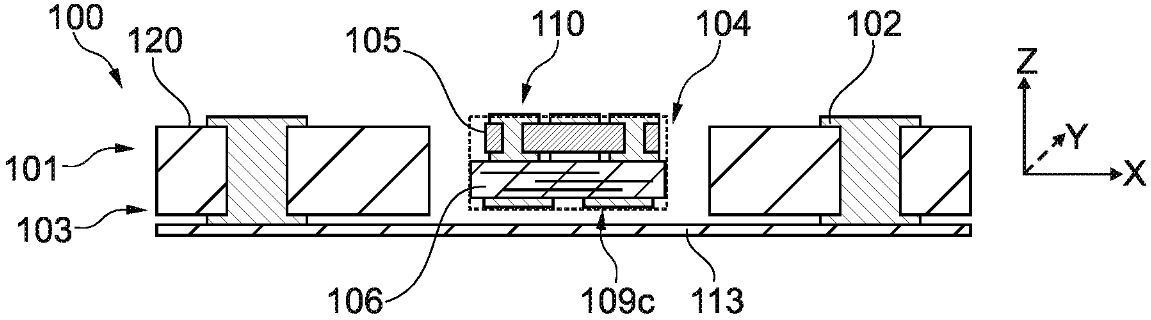

In FIG. 9 an inlay substrate 110, comprising a component 105 stacked on top and electrically and functionally coupled to an IC substrate 106, is placed within the cavity 104. The component 105 and the IC substrate 106 may be stacked before embedding the component 105 and the IC substrate 106 in the cavity 104. Here, the IC substrate 106 comprises a further redistribution structure 109*c*.

Figure 10:
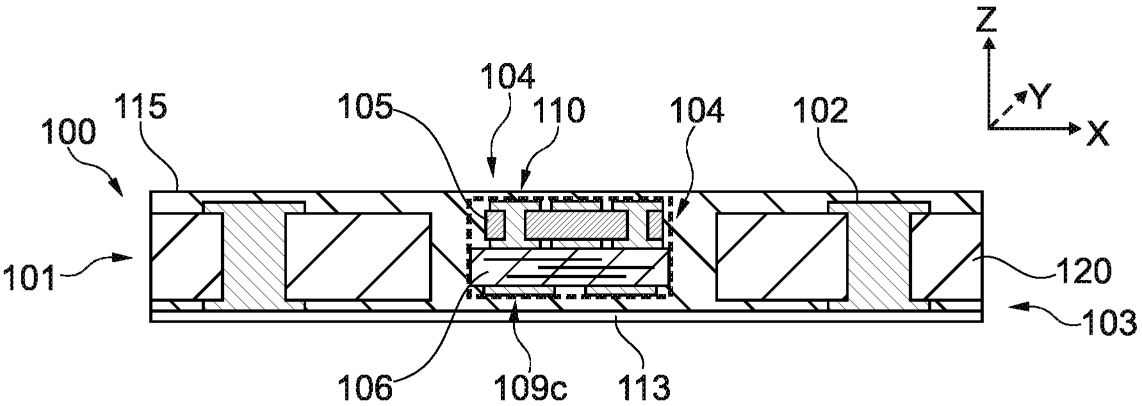

In FIG. 10 an electrically insulating material 115, such as prepreg, is added. The electrically insulating material 115 fills the voids of the cavity 104 and becomes part of the electrically insulating layer structure 103.

Alternatively, according to other embodiments of the disclosure, the component 105 or the IC substrate 106 may be placed in the cavity 104 first, and thereafter the respective other one of the component 105 and the IC substrate 106 may be stacked thereon in the cavity 104.

In yet another embodiment of the disclosure, one of the component 105 or the IC substrate 106 may be pressed in a first electrically insulating layer of the electrically insulating layer structure 103 in the cavity 104, so that it becomes at least partially embedded by the first electrically insulating layer. Subsequently, the respective other one of the component 105 or the IC substrate 106 may be pressed in a second electrically insulating layer of the electrically insulating layer structure 103, so that it also becomes at least partially embedded by the second electrically insulating layer and so that the component 105 and the IC substrate 106 become electrically and/or functionally connected. By pressing one of the component 105 or the IC substrate 106, or the prefabricated inlay substrate 110, into the cavity 104, any excess electrically insulating material 115 is displaced. Preferably, the first electrically insulating layer and/or the second electrically insulating layer comprises prepreg.

Figure 11:
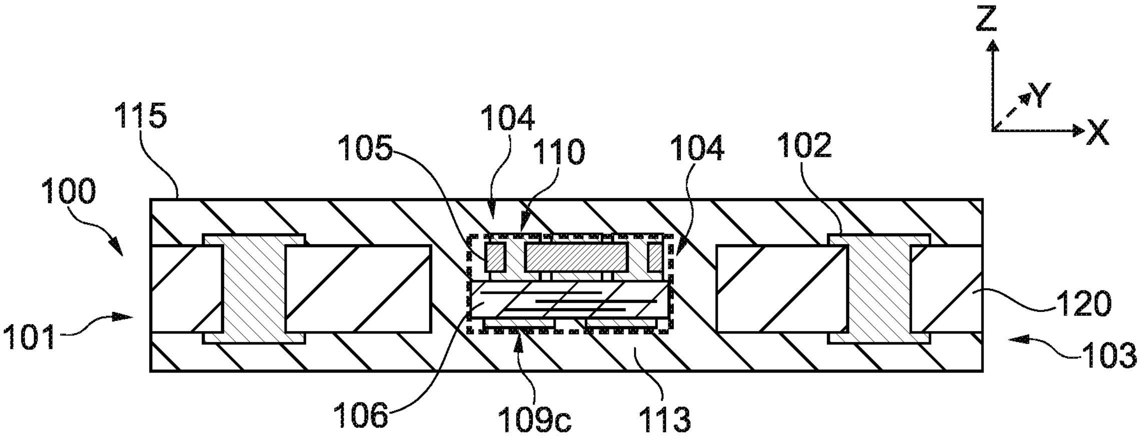

In FIG. 11 after embedding the component 105 and the IC substrate 106 in the cavity 104, the stack 101 is removed from the release layer 113.

Figure 12:
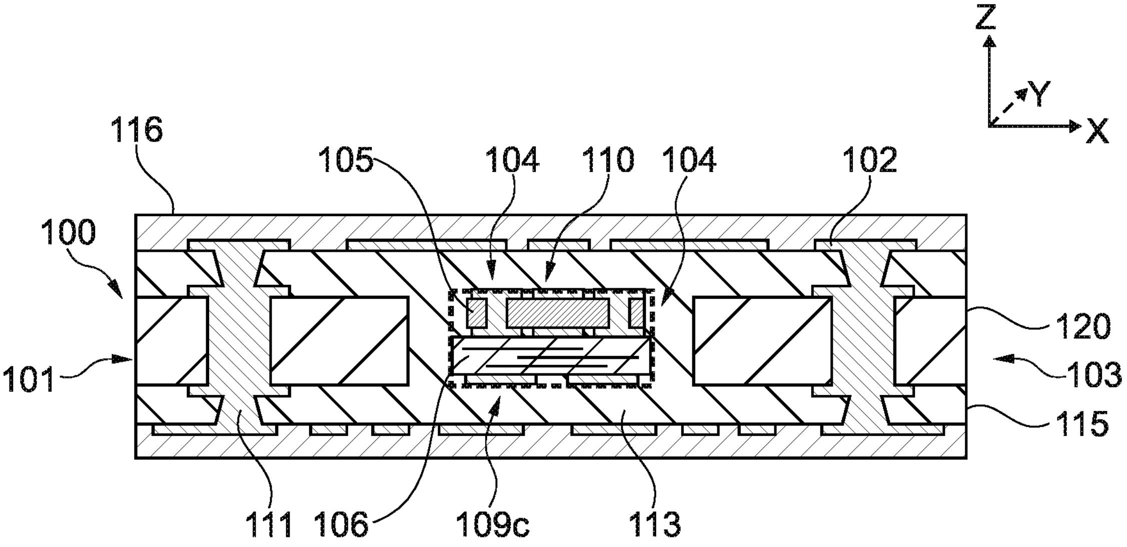

In FIG. 12 electrically conductive layer structures 102, electrically insulating layers 116, and electrically conductive through connections 111 are formed. The component carrier 100 may then be subject to further manufacturing steps, which are not shown in detail, but which may for example result in a component carrier 100 as depicted in one of the FIGS. 3 to 6 described in detail above.

Figure 13:
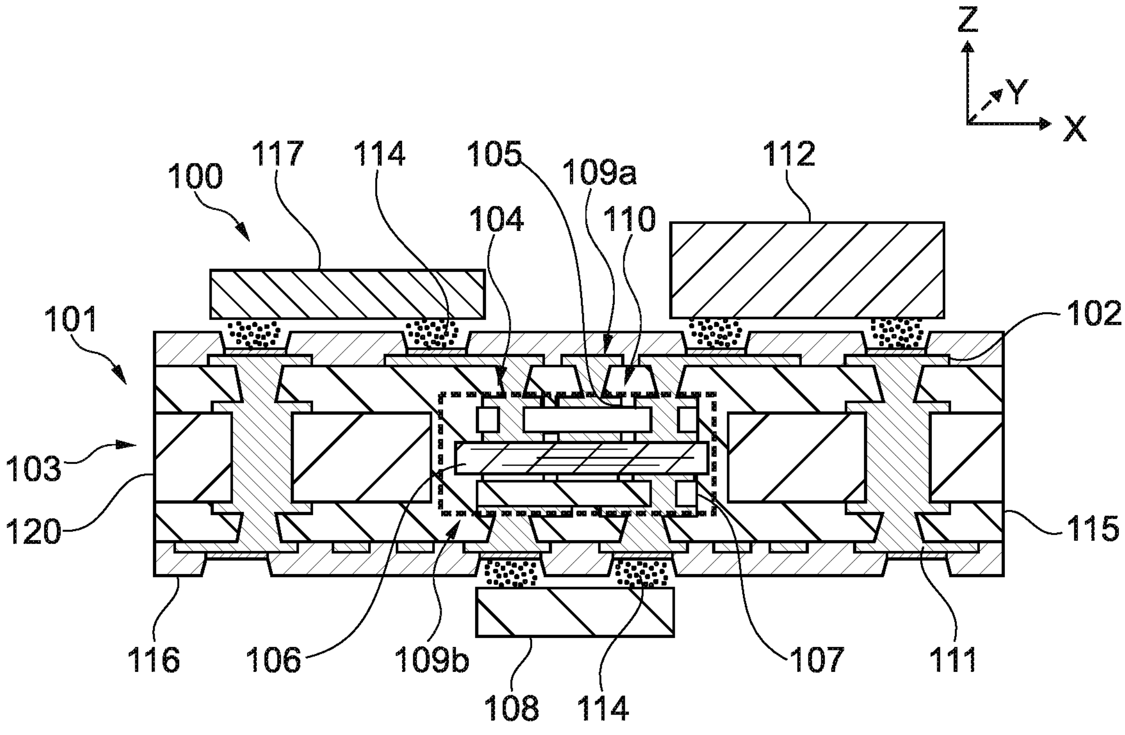
FIG. 13 shows a component carrier with an inlay substrate and a plurality of surface mounted components, according to an exemplary embodiment of the disclosure.

FIG. 13 shows a component carrier 100 with an inlay substrate 110 and a plurality of surface mounted components 108, 112, and 117, according to an exemplary embodiment of the disclosure. The embodiment shown in FIG. 13 may be compared to the embodiment depicted in FIG. 5 described above. However, as has been mentioned earlier, the component carrier 100 comprises a component 105, an IC substrate 106, and additionally, a first further component 107 stacked with the IC substrate 106, wherein the component 105 and the first further component 107 are arranged on two opposing main surfaces of the IC substrate 106. The IC substrate 106 is electrically and/or functionally connected to both, the component 105 and the first further component 107. Hence, the IC substrate 106 serves as a substrate for both, the component 105 and the first further component 106, which may contribute to a compact design of the component carrier 100.

Figure 14:
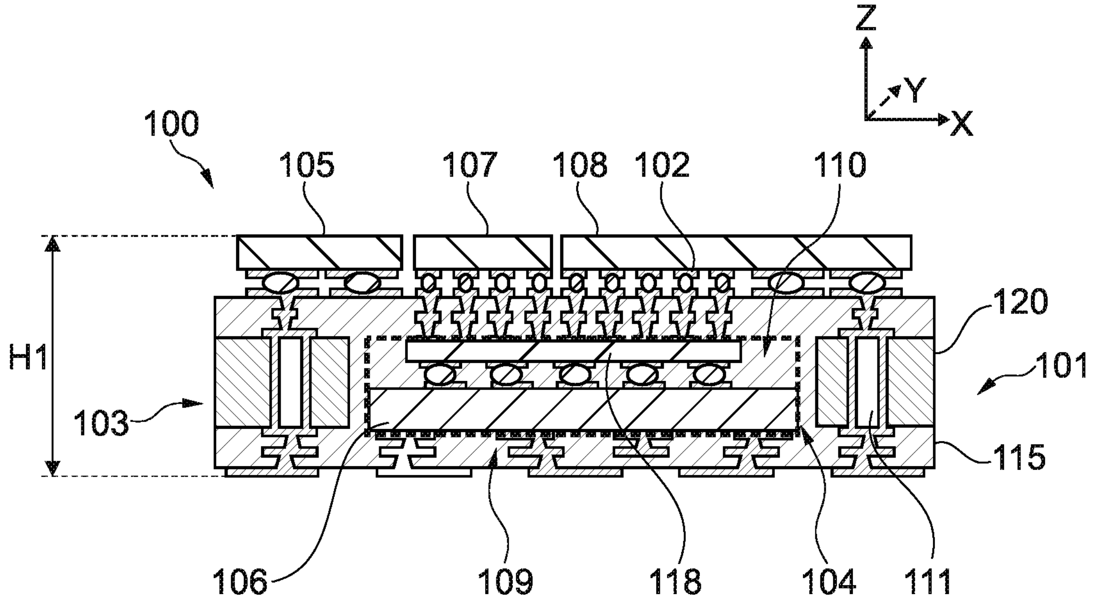
FIG. 14 shows a cross-sectional view of a stack of a component carrier with an inlay substrate comprising an interposer structure, according to an exemplary embodiment of the disclosure.
Figure 15:
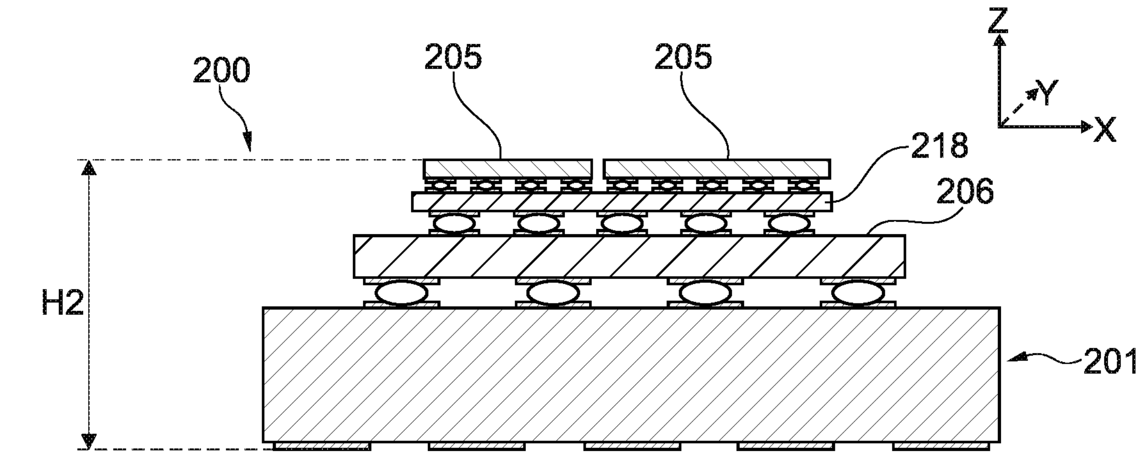
Fig. 15 Prior art
FIG. 15 shows a cross-sectional view of a stack of a component carrier comprising an interposer structure as known in the art.

FIG. 14 shows a component carrier 100 with an inlay substrate 110 according to a further exemplary embodiment and similar to the one shown in FIG. 1. However, components 105, 107, and 108 are arranged on a top main surface of the component carrier, and in the inlay substrate 110, there is comprised an interposer structure 118 electrically connected to both the components 105, 107, and 108 and to the IC substrate 106, which is also comprised by the inlay substrate 110 and stacked with the interposer structure 118. However, it is noted that in addition to the interposer structure 118, according to a further exemplary embodiment, the inlay substrate 110 may of course further comprise one or more components 105, 107, 108, stacked with the IC substrate 106 and/or the interposer structure 118. As can further be taken from FIG. 14, the interposer structure enables connecting a plurality of components 105, 107, 108 comprising a plurality of electrical contacts, to the IC substrate 106 comprising fewer electrical contacts. Furthermore, the height H1 of the component carrier 100 is significantly reduced to the height H2 of the prior art component carrier 200, which is shown in FIG. 15. This advantageous arrangement for saving vertical space is effected by embedding the inlay substrate 110 in the cavity 104. In contrast, component carrier 200 has all elements, i.e., the components 205, the interposer structure 218, and the IC substrate 206, surface mounted to the stack 201.

Figure 16:
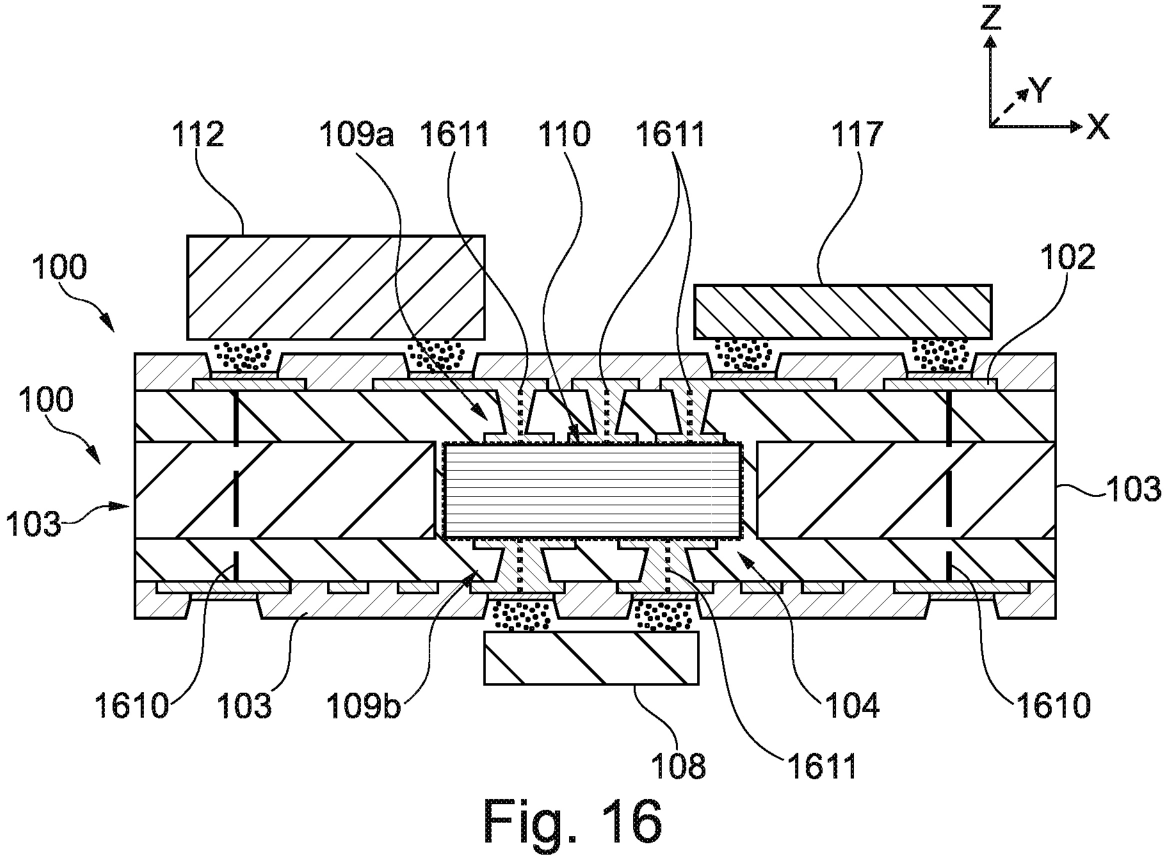
FIG. 16 shows a cross-sectional view of a stack of a component carrier structure according to an exemplary embodiment of the disclosure, demonstrating electrical paths.

FIG. 16 shows the component carrier 100 of FIG. 5 according to a further exemplary embodiment. However, in FIG. 16, the component carrier 100 does not comprise vertical electrically conductive through connections 111. Furthermore, in order not to obscure the Figure, the inlay substrate 110 is depicted without any further elements shown. FIG. 16 demonstrates with reference numerals 1610 and the dashed line an electrical path in a vertical direction, as would be expected if vertical electrically conductive through connections 111 were provided.

However, by embedding the inlay substrate 110 according to an embodiment, the electrical path, now represented by dotted lines 1611, leads from surface mounted components 112, 117 via the top lay of the electrically conductive layer structure 102 through the inlay substrate 110 and its elements (i.e., interposer structure 118, component, IC substrate 106, etc.) via a bottom layer of the electrically conductive layer structure 102 to a component 108 (or vice versa). In other words, instead of (or in addition to) providing electrically conductive through connections 111, as may be known from the prior art, further electronic elements may be integrated into a vertical electrical path and may facilitate said electrical path 1611.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS

H1 Height of stack
H2 Height of stack (prior art)
X Horizontal direction
Y Horizontal direction
Z Vertical (stacking) direction
100 Component Carrier
101 Stack
102 Electrically conductive layer structure
103 Electrically insulating layer structure
104 Cavity
105 Component
106 IC substrate
107 First further component
108 Second further component
109*a* First redistribution structure
109*b* Second redistribution structure
109*c* Further redistribution structure
110 Inlay substrate
111 Electrically conductive through connection
112 Third further component
113 Release layer
114 Solder ball
115 Electrically insulating material, prepreg
116 Electrically insulating layer, solder resist
117 Fourth further component
118 Interposer structure
120 Electrically insulating core layer
200 Component carrier (prior art)
201 Stack (prior art)
205 Component (prior art)
206 IC substrate (prior art)
218 Interposer structure (prior art)
1610 Electric pathway (prior art)
1611 Electric pathway

The invention claimed is:

1. A component carrier, comprising:
a stack comprising at least one electrically conductive layer structure and at least one electrically insulating layer structure;
a cavity in the stack;
an inlay substrate at least partially embedded in the cavity, wherein the inlay substrate comprises a component and an IC substrate stacked one above the other;
a first redistribution structure that electrically connects the component to a first component carrier main surface; and
a second redistribution structure that electrically connects the IC substrate to a second component carrier main surface being opposed to the first component carrier main surface;
wherein the IC substrate comprises a third redistribution structure.

2. The component carrier according to claim 1, further comprising:
an interposer structure arranged between the component and the IC substrate.

3. The component carrier according to claim 1,
wherein the component and the IC substrate are indirectly electrically connected by an electrically conductive material or are directly electrically connected by means of thermal compression bonding.

4. The component carrier according to claim 1,
wherein, in a vertical direction, the component is located above the IC substrate in the cavity, or
wherein, in a vertical direction, the IC substrate is located above the component in the cavity.

5. The component carrier according to claim 1,
wherein the component and the IC substrate are functionally coupled.

6. The component carrier according to claim 1,
wherein the component carrier comprises a second component stacked with the IC substrate.

7. The component carrier according to claim 6,
wherein the component and the second component are arranged on two opposing main surfaces of the IC substrate.

8. The component carrier according to claim 6,
wherein the component and the second component are arranged side by side on the same main surface of the IC substrate.

9. The component carrier according to claim 1,
wherein the component carrier comprises a second component being surface mounted on the stack.

10. The component carrier according to claim 1,
wherein the IC substrate comprises a plurality of electrically conductive layer structures, and
wherein an integration density of the electrically conductive layer structures of the IC substrate is higher than an integration density of electrically conductive layer structures of the stack.

11. The component carrier according to claim 1,
wherein the component comprises an active component.

12. The component carrier according to claim 11,
wherein a second component is at least one of a second active component, a passive component, a heat removal block.

13. The component carrier according to claim 1, comprising at least one of the following:
wherein the component comprises at least one pad being oriented downwardly in a vertical direction;
wherein the component comprises at least one pad being oriented upwardly in a vertical direction.

14. The component carrier according to claim 1,
wherein the cavity is formed in an electrically insulating core layer of the electrically insulating layer structure.

15. The component carrier according to claim 1,
wherein the component carrier comprises an optical pathway formed partially by at least one of the stack or partially by the component.

16. The component carrier according to claim 1,
wherein the IC substrate is electrically coupled with the at least one electrically conductive layer structure of the stack.

17. The component carrier according to claim 1,
wherein the inlay substrate is embedded in electrically insulating material.

18. A method of manufacturing a component carrier, the method comprising:

forming a stack comprising at least one electrically conductive layer structure and at least one electrically insulating layer structure;

forming a cavity in the stack;

at least partially embedding an inlay substrate in the cavity, wherein the inlay substrate comprises a component and an IC substrate stacked one above the other, providing a first redistribution structure that electrically connects the component to a first component carrier main surface, and providing a second redistribution structure that electrically connects the IC substrate to a second component carrier main surface being opposed to the first component carrier main surface;

wherein the IC substrate comprises a third redistribution structure.

19. The method according to claim 18, the method further comprising at least one of the following steps:

inserting the component or the IC substrate in the cavity and thereafter stacking the respective other one of the component and the IC substrate thereon in the cavity;

stacking the component and the IC substrate before embedding the component and the IC substrate in the cavity;

pressing the component in a first electrically insulating layer of the electrically insulating layer structure, so that the component becomes at least partially embedded by the first electrically insulating layer;

pressing the IC substrate in a second electrically insulating layer of the electrically insulating layer structure, so that the IC substrate becomes at least partially embedded by the second electrically insulating layer.

20. A component carrier, comprising:

a stack comprising at least one electrically conductive layer structure and at least one electrically insulating layer structure;

a cavity in the stack;

an inlay substrate at least partially embedded in the cavity, wherein the inlay substrate comprises a component and an IC substrate stacked one above the other;

a first redistribution structure that electrically connects the component to a first component carrier main surface;

a second redistribution structure that electrically connects the IC substrate to a second component carrier main surface being opposed to the first component carrier main surface; and an interposer structure arranged between the component and the IC substrate.

21. A component carrier, comprising:

a stack comprising at least one electrically conductive layer structure and at least one electrically insulating layer structure;

a cavity in the stack;

an inlay substrate at least partially embedded in the cavity, wherein the inlay substrate comprises a component and an IC substrate stacked one above the other;

a first redistribution structure that electrically connects the component to a first component carrier main surface; and a second redistribution structure that electrically connects the IC substrate to a second component carrier main surface being opposed to the first component carrier main surface;

wherein the component carrier comprises a second component stacked with the IC substrate, and wherein the component and the second component are arranged on two opposing main surfaces of the IC substrate.

* * * * *